United States Patent
Nadig et al.

(10) Patent No.: US 7,623,581 B2
(45) Date of Patent: Nov. 24, 2009

(54) REFERENCE CLOCK RECOVERY FOR "EYE" MEASUREMENTS

(75) Inventors: Srikrishna H. Nadig, Rajajinagan (IN); Kalev Sepp, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 546 days.

(21) Appl. No.: 11/228,664

(22) Filed: Sep. 15, 2005

(65) Prior Publication Data

US 2007/0133726 A1   Jun. 14, 2007

(51) Int. Cl.
*H04L 12/28* (2006.01)
*G01R 13/00* (2006.01)

(52) U.S. Cl. .................. 375/260; 370/395; 370/360; 702/69

(58) Field of Classification Search ......... 370/395–516; 375/224–226, 238–360, 362–376; 702/67–73, 702/106–189
See application file for complete search history.

(56) References Cited

U.S. PATENT DOCUMENTS

| | | | | |
|---|---|---|---|---|
| 5,825,834 | A * | 10/1998 | Chambers et al. | 375/360 |
| 6,661,836 | B1 * | 12/2003 | Dalal et al. | 375/226 |
| 6,812,688 | B2 * | 11/2004 | Tan et al. | 324/121 R |
| 6,836,738 | B2 * | 12/2004 | Sepp et al. | 702/67 |
| 6,871,152 | B2 * | 3/2005 | Nygaard, Jr. | 702/67 |
| 6,977,959 | B2 * | 12/2005 | Brunn et al. | 375/219 |
| 7,016,445 | B2 * | 3/2006 | Bronfer et al. | 375/355 |
| 7,203,610 | B2 * | 4/2007 | Tabatabaei et al. | 702/69 |
| 7,310,392 | B2 * | 12/2007 | Miller | 375/348 |
| 2005/0193355 | A1 * | 9/2005 | Hildebrant et al. | 716/6 |
| 2006/0050827 | A1 * | 3/2006 | Saeki et al. | 375/362 |

OTHER PUBLICATIONS

T.10 Specification Guide for SAS, T10/1601-D Revision 9d, Working Draft for Serial Attached SCSI—1.1 (SAS-1.1), Section 5.3.5.3 "Receiver device eye mask", published by American National Standards Institute, (ANSI), May 30, 2005, Copyright 2005.

* cited by examiner

*Primary Examiner*—M. Phan
(74) *Attorney, Agent, or Firm*—Francis I. Gray; Thomas F. Lenihan

(57) ABSTRACT

A method for recovering a clock from a serial data stream for use in producing "eye" diagram measurements includes determining an initial recovered clock from the serial data stream based upon transition edges. Time interval error values are then determined as a function of the transition edges and corresponding initial recovered clock times. Time interval error values are interpolated for initial recovered clock times not associated with transition edges to produce a complete set of time interval error values. The complete set of time interval error values are lowpass filtered to produce a filtered set of time interval error values. The clock for the serial data stream is reconstructed from the filtered set of time interval error values.

4 Claims, 5 Drawing Sheets

REFERENCE CLOCK RECOVERY FOR "EYE" MEASUREMENTS

BACKGROUND OF THE INVENTION

The present invention relates to visualization of waveforms for a serial data stream, and more particularly to reference clock recovery from the serial data stream in order to perform "eye" diagram measurements that provide a visual indication of voltage and timing uncertainties associated with the serial data stream.

In serial data communications an "eye" diagram is used to visualize how the signals used to transmit multiple bits of data representing a serial data stream may potentially lead to errors in the interpretation of the data bits. This problem is known as inter-symbol interference. For a realtime "eye" diagram a clock needs to be recovered from the data, which clock is then used to slice the data into bits that are in turn rendered to produce the "eye" diagram. From the "eye" diagram various parameters may be measured, such as "eye" width, "eye" height of transition and non-transition bits, and optimal jitter. The clock recovery is key for slicing the data. The clock may be recovered from the data using a constant clock recovery (CCR) technique as disclosed in U.S. Pat. No. 6,836,738 entitled "Method for Optimized Rendering of Eye Diagrams Synchronized to a Recovered Clock and Based on a Single Shot Acquisition." In this technique an input signal is acquired, edge timing is measured and then a symbol rate (or unit interval) is estimated. From the edge timing and the estimated symbol rate the clock signal is derived. The drawback of this method, as shown in FIG. 1, is that the resulting "eye" diagram using the recovered clock includes both high and low frequency jitter, with the low frequency jitter (wander) being reflected as jitter.

An emerging technology for data transfer between data storage devices, such as a hard disk and a personal computer (PC), is Serial Attached SCSI (SAS). This interface is a combination of serial data and SCSI (Small Computer System Interface) that has the advantage of data rate speeds up to 3 Gbs (gigabits per second) with reliable data transfer. Unfortunately the requirement for clock recovery as specified by the T.10 Specification Guide for SAS (T10/1601-D Revision 9d, Working Draft for Serial Attached SCSI-1.1 (SAS-1.1), Section 5.3.5.3 "Receiver device eye mask", published by American National Standards Institute (ANSI) 30 May 2005) is not satisfied by the constant clock recovery technique as taught in the above-mentioned U.S. Pat. No. 6,836,738. To ensure interoperability of the SAS with different manufacturers, the SAS foundation developed a compliance test procedure, one of which is to ensure signal integrity at high speed which is evaluated using the "eye" diagram measurement.

SAS evolved to address the escalating and more complex storage requirements, factors such as larger capacity, density, security, scalability and accessibility that are more critical than ever. Enterprise data communication centers need to (i) be online all the time, (ii) fulfill requests from numerous users simultaneously, (iii) allow for constant growth and expansion and (iv) be maintained while in operation. SAS has the capability of fulfilling these requirements as well as providing the necessary performance and scalability to move data at gigabit speeds—speeds that meet or exceed current storage input/output (I/O) performances found in ATA (Advanced Technology Attachment), SATA (Serial ATA), SCSI or Fibre Channel systems. The application area includes servers, network attached storage (NAS) and storage area network (SAN). The challenge for designers and test houses requires testing the SAS devices and complying with the specification.

There is no direct solution available to run the "eye" diagram measurements for SAS using a recovered clock as described in U.S. Pat. No. 6,836,738. Another way of recovering the clock is by using a first order phase-locked loop (PLL) technique with the incoming data. A PLL is a feedback system containing three basic components—phase detector, loop filter and voltage-controlled oscillator. Simulating the PLL with time domain simulators needs more computer time since thousands of clock cycles need to be simulated to obtain meaningful results.

The PLL is a closed loop mechanism that needs a transfer function that is stable and robust enough to handle jitter and phase shift. The phase of an input signal is extracted by finding the rising or falling edges of the digitized version of the input signal. A digital simulation of an actual hardware PLL circuit may be realized because the input and output signals exist just as digital information. In this case the voltage values at several points in the PLL circuit are expressed in the time domain and are repetitively calculated to derive their time variation. The time interval of the calculation must be sufficiently small to retain the high precision of the simulation. Hence it requires a significant amount of digital processing capability to simulate the actual PLL within a reasonable amount of time.

In the PLL method the PLL phase transfer function is determined by the characteristics of the simulated components. As long as the simulation observes the laws of physics, the resultant transfer function does not differ from that of the actual hardware PLL circuit. Given the time to process the data in the simulation, using this method is not advisable. Hence the first order transfer function to be realized by this method also is not particularly useful.

The recommended procedure according to the T.10 Specification Guide is to extract the clock after passing it through a filter. Note that the first order transfer function may be realized by a convolution method. This method is inherently stable as far as an appropriate impulse response is adopted because it does not include any feedback loop.

What is desired is a clock recovery technique for extracting a wander-tracked clock from a serial data stream in order to perform more accurate "eye" measurements.

BRIEF SUMMARY OF THE INVENTION

Accordingly the present invention provides for the recovery of a clock from a serial data stream in order to perform "eye" measurements. The technique includes determining an initial recovered clock from the serial data stream based upon transition edges. Time interval error values are then determined as a function of the transition edges and corresponding initial recovered clock times. Time interval error values are interpolated for initial recovered clock times not associated with transition edges to produce a complete set of time interval error values. The complete set of time interval error values are lowpass filtered to produce a filtered set of time interval error values. The clock for the serial data stream is adjusted by the filtered set of time interval error values. The initial condition response of the lowpass filter may be handled by discarding, averaging or both techniques, or by starting from an arbitrary time in filter output.

DETAILED DESCRIPTION OF THE INVENTION

Figure 2:
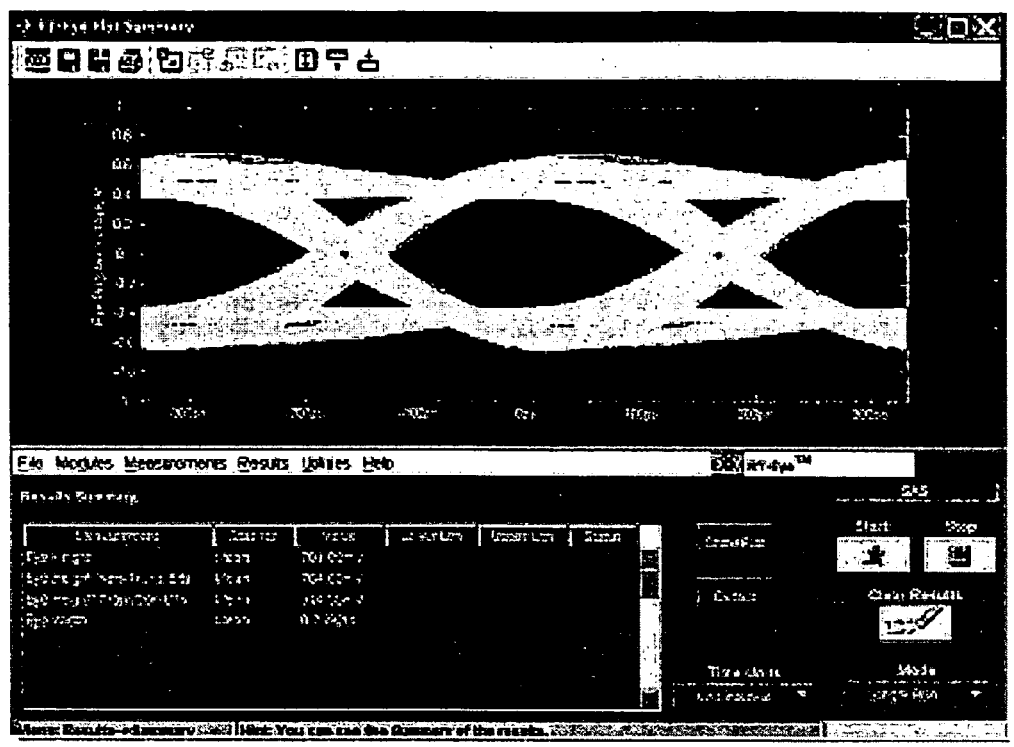
FIG. 2 is a graphic view of an "eye" diagram using a wander-tracked reference clock according to the present invention.
Figure 1:
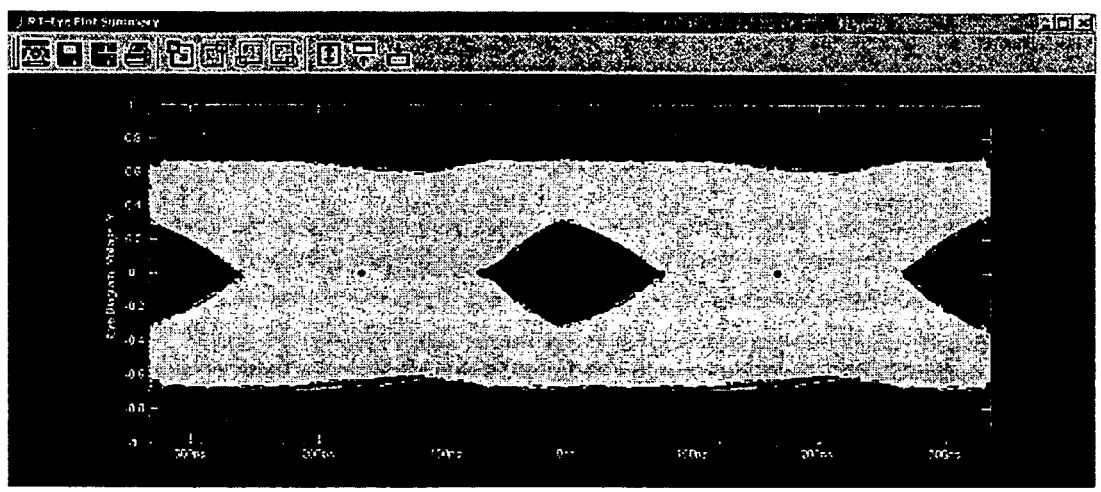
FIG. 1 is a graphic view of an "eye" diagram using only a constant clock recovery method according to the prior art.

The "eye" diagram using only a constant clock recovery (CCR) method, shown in FIG. 1, has a lot of wander that is reflected as overall jitter on the "eye" diagram, as discussed above, whereas the "eye" diagram using a wander-tracked clock as recovered according to the present invention, shown in FIG. 2, reflects only the high frequency jitter.

The CCR algorithm as described in U.S. Pat. No. 6,836,738 is used to calculate a recovered clock. CCR is done by using a least square fit algorithm applied to transition time intervals with a pre-defined data rate. The difference between the estimated clock transition times and the actual transition times is time interval error (TIE). The calculated TIE values have both high and low frequency jitter components, and are available at the actual data transitions. The transitions may not happen at the data rate, such as for non-return to zero (NRZ) data, and depend upon the bit encoding of the serial data stream. So intermediate TIE values at each estimated intermediate unit interval between signal transition times are calculated using a linear interpolation.

The complete set of TIE values are passed through an infinite impulse response (IIR) first order lowpass filter (LPF), such as a Butterworth filter designed with a cut-off frequency of $f_{BAUD}/1667$ as specified in the T.10 Specification Guide, in order to remove the high frequency content. $F_{BAUD}$ depends on a device usage model and represents a signal speed of 1.5 Gbs and 3.0 Gbs. The purpose of using the LPF is to remove the high frequency jitter and retain all the low frequency jitter, i.e., wander, of the TIE values. The recovered clock by CCR is corrected by adding the low frequency jitter, which is equivalent to tracking the wander.

Reconstructed_Clock=CCR_Clock_Transitions+LPF (TIE)

The design details and calculation of filter coefficient variables that are used in the implementation of the single pole (first order) Butterworth LPF are referenced from standard text books as mentioned in *Digital Signal Processing: A Practical Approach*, $2^{nd}$ Edition, by Emmanuel C. Ifeachor and Barrie W. Jervis published by Prentice Hall (2001), ISBN: 0201596199.

Figure 3:
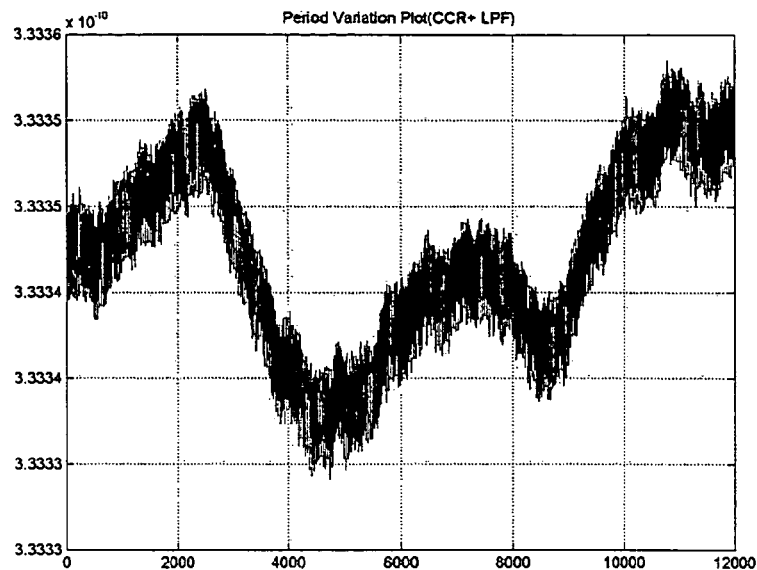
FIG. 3 is a graphic view of a plot of unit interval versus time for a reconstructed clock according to the present invention.
Figure 4:
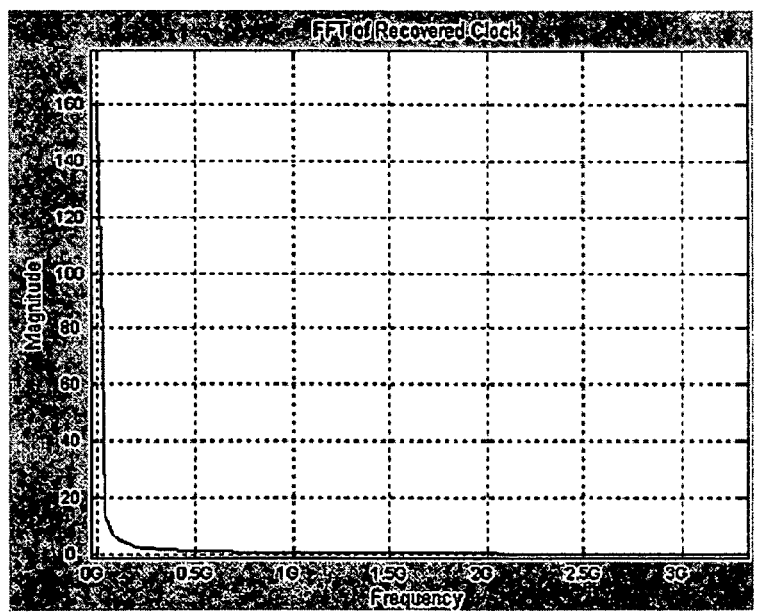
FIG. 4 is a graphic view of a frequency domain representation of the reconstructed clock according to the present invention.

FIG. 3 shows a unit interval or clock period difference plot using the reconstructed clock which shows that the reconstructed clock is following the wander, while FIG. 4 shows a fast Fourier transform of the reconstructed clock with the high frequency jitter components above the cut-off frequency removed.

Figure 5:
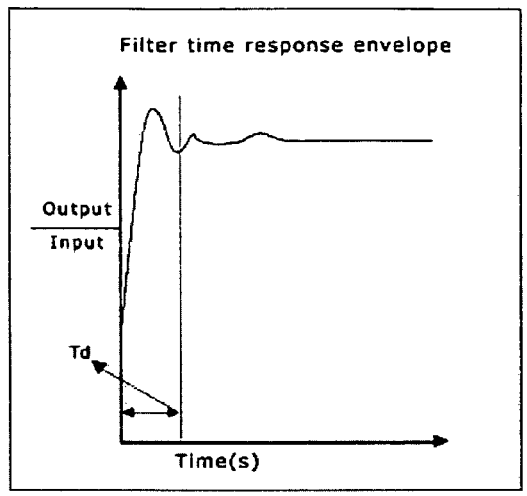
FIG. 5 is a graphic view illustrating a filter transient response.

A graph of the filter response is shown in FIG. 5. Initially the filter ramps up and then tries to settle down after a few time constants indicated by the vertical dotted line. The first portion of the response is dominated by an initial condition response that typically takes a few time constants to settle. The time constant is determined by the smallest pole (eigenvalue) of the system, i.e., in the case of a first order filter by its cut-off frequency. The duration from the starting point to the vertical dotted line is called "transition time", denoted as $T_d$. The initial ramping up indicates how initial conditions are used for the filter behavior. During this initial ramping up there may be significant error between the input and output of the filter, and thus there is a need to overcome the transient effect of the filter. The simplest method is to discard the $T_d$ time duration of filter outputs.

There are different configurations to handle initial filter conditions to overcome the transient response of the filter.

1. Averaging and backward filtering technique: Calculate the initial state of the filter using the first 2.0 time constants of data and further refine the initial filter conditions using backward filtering. The 2.0 time constants are derived after experimenting with different waveforms and this value optimally calculates the initial conditions. Four point averaging is done on the first sample point until the 2.0 time constant of data. Using the last sample averaged value as the initial condition for backward filtering, do the backward filtering from the 2.0 time constant sample points to the first sample point. The filtered initial value is used as the initial condition for forward filtering.
2. Discarding the beginning of the filtered data: Configure the desired data points to be discarded after filtering as a time constant value. This configuration is provided as the transient time. The range of one time constant to ten time constants is provided depending on the signal speed 1.5 Gbs and 3 Gbs.
3. Both discarding and averaging: Select both of the above options to provide better filter initial condition handling. By selecting both the initial condition is calculated by averaging and backward filtering and then discarding the configured amount of data. Both options help to discard minimum data because initial conditions are already calculated.
4. Starting from an arbitrary value: If the above options are not selected, then the initial condition for filtering is from an arbitrary (first sample value) sample.

Figure 6:
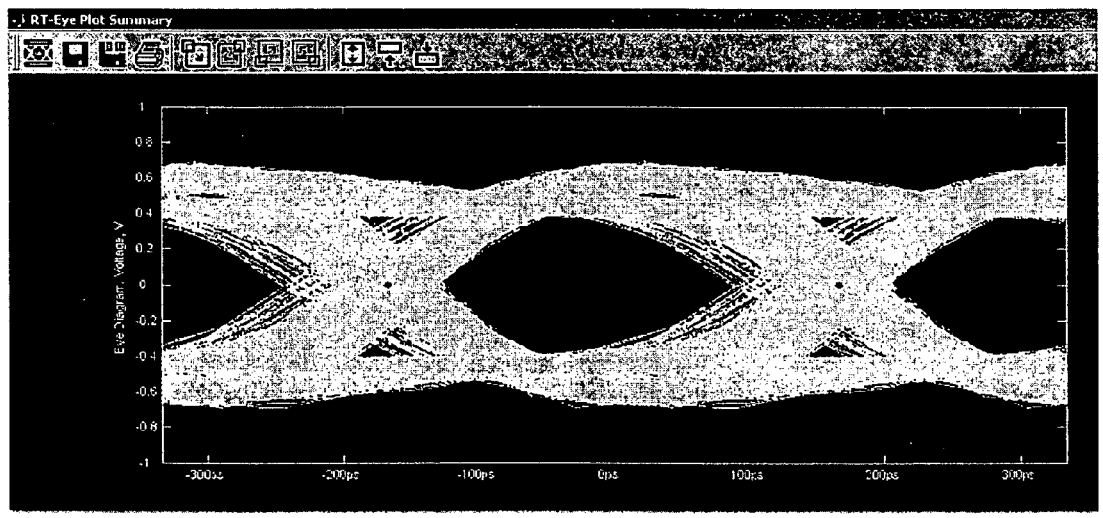
FIG. 6 is a graphic view of an "eye" diagram including filter transient response using a reconstructed clock according to the present invention.
Figure 7:
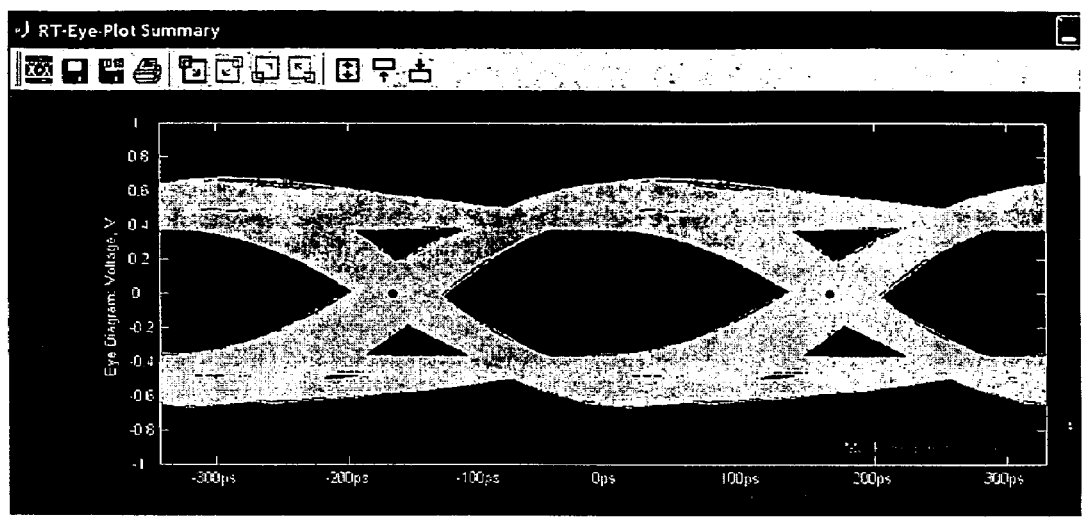
FIG. 7 is a graphic view of an "eye" diagram with filter transient response being overcome using a reconstructed clock according to the present invention.

FIG. 6 shows an "eye" diagram spread due to the transient response of the filter which appears as more jitter by spreading the first few sample points. The resulting "eye" diagram may violate an applied mask. On the other hand FIG. 7 shows a clean "eye" diagram rendered by using the averaging technique for the initial filter conditions as described above.

Figure 8:
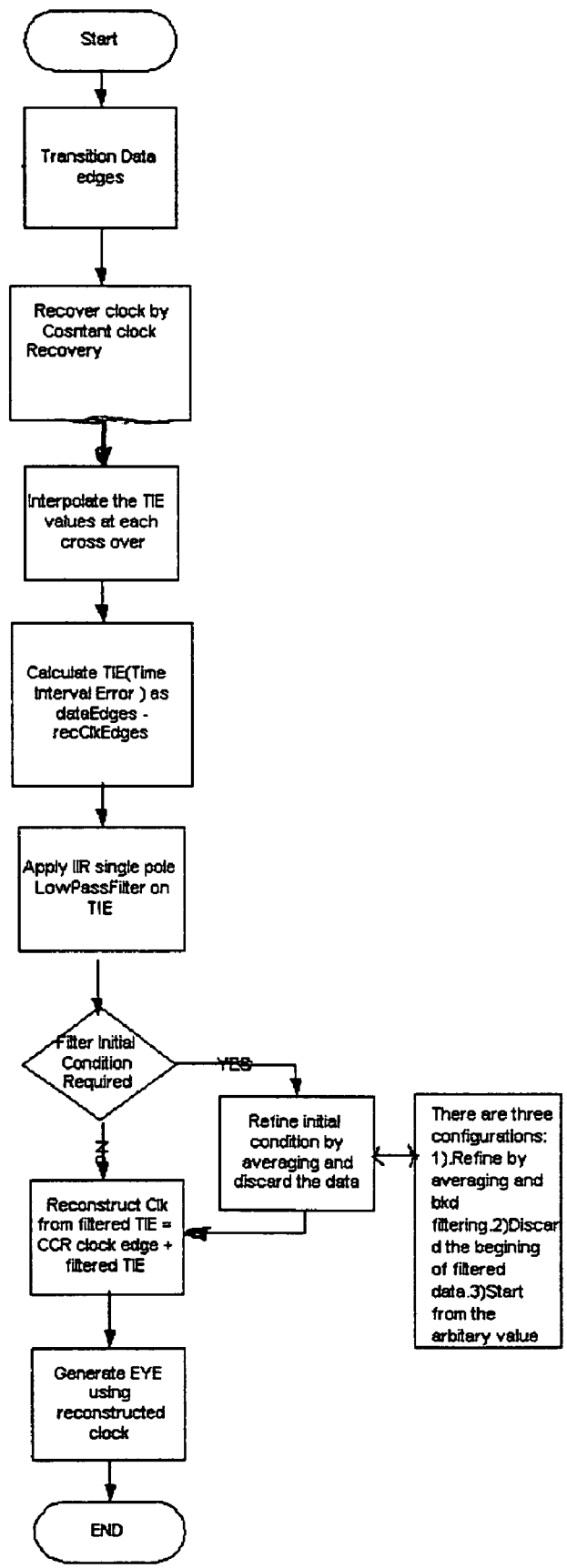
FIG. 8 is a flow diagram view for the method of recovering a clock from the serial data stream according to the present invention.

In summary the clock recover algorithm is shown in FIG. 8. The transition data edges are detected and a recovered clock is determined using the CCR technique of U.S. Pat. No. 6,836,738. This provides time interval error values at each transition point of the input signal. In order to populate the subsequent filter, TIE values are interpolated for each clock point, i.e., edges are interpolated for each clock cycle not corresponding to an actual signal transition. The full set of TIE values are then lowpass filtered to eliminate the high frequency jitter component, and the clock is then reconstructed from the filtered TIE values. If TIE values are required for the part of the waveform where filter initial conditions dominate, then the initial condition is refined by one of the methods described above before reconstructing the clock from the filtered TIE values. The "eye" diagram for measurements is then generated using the reconstructed clock.

Thus the present invention provides a reconstructed clock from the serial data stream that tracks the signal wander so that a resulting "eye" diagram is produced that shows only the high frequency jitter for measurement.

What is claimed is:

1. A method of recovering a clock from a serial data stream comprising the steps of:
   determining an initial recovered clock using a constant clock recovery method based on transition edges in the serial data stream;
   obtaining a complete set of time interval error values for each cycle of the initial recovered clock;
   filtering the complete set of time interval error values to remove a high frequency component, producing a filtered set of time interval error values; and
   reconstructing the clock for the serial data stream from the filtered set of time interval error values;
   wherein the obtaining step comprises the steps of:
   calculating time interval error values for the transition edges as a function of the initial recovered clock; and
   interpolating time interval error values for each cycle of the initial recovered clock where there is no corresponding transition edge, the calculated and interpolated time interval error values providing the complete set of time interval error values.

2. The method as recited in claim 1 further comprising the step of determining an initial filter condition for the filtering step based on initial samples of the filtered set of time interval error values.

3. The method as recited in claim 1 further comprising the step of determining an initial filter condition for the filtering step based on initial samples of the filtered set of time interval error values.

4. The method as recited in claim 1 wherein the filtering step comprises using a first order lowpass filter to remove the high frequency component from the complete set of time interval error values.

* * * * *